United States Patent [19]

Koishi

[11] Patent Number: 5,513,197
[45] Date of Patent: Apr. 30, 1996

[54] SEMICONDUCTOR LASER DRIVE CIRCUIT INCLUDING SWITCHED CURRENT SOURCE

[75] Inventor: Kenji Koishi, Takarazuka, Japan

[73] Assignee: Matsushita Electric Industrial Co., Ltd., Osaka, Japan

[21] Appl. No.: 149,568

[22] Filed: Nov. 9, 1993

[30] Foreign Application Priority Data

Nov. 12, 1992 [JP] Japan .................... 4-302025

[51] Int. Cl.$^6$ .................... H01S 3/10; H01S 3/00; G11B 7/00
[52] U.S. Cl. .................... 372/38; 372/26; 369/116
[58] Field of Search .................... 372/26, 29, 30, 372/31, 38; 369/106, 115, 116, 122

[56] References Cited

U.S. PATENT DOCUMENTS

| | | | |
|---|---|---|---|
| 4,539,686 | 9/1985 | Bosch et al. | 372/38 |
| 4,796,267 | 1/1989 | Yamada et al. | 372/31 |
| 4,799,224 | 1/1989 | Bottacchi et al. | 372/38 |
| 4,835,780 | 5/1989 | Sugimura et al. | 372/29 |
| 5,150,351 | 9/1992 | Ohno et al. | 369/116 |
| 5,191,589 | 3/1993 | Amano et al. | 372/38 |
| 5,224,112 | 6/1993 | Uesaka et al. | 372/38 |
| 5,276,671 | 1/1994 | Minami et al. | 372/38 |

FOREIGN PATENT DOCUMENTS

| | | | |
|---|---|---|---|
| 2-63756 | 3/1990 | Japan . | |
| 0095735 | 4/1991 | Japan | 369/122 |
| 0245327 | 10/1991 | Japan | 369/122 |

Primary Examiner—Rodney B. Bovernick
Assistant Examiner—Robert McNutt
Attorney, Agent, or Firm—Wenderoth, Lind & Ponack

[57] ABSTRACT

A first current source applies a first current to an anode of a semiconductor laser, and a second current source either draws a second current from the anode of the semiconductor layer or supplies the second current to the anode of the semiconductor layer. A switched current source connected to the anode of the semiconductor layer selectively draws a third current from the anode of the semiconductor laser. The third current has a value corresponding to a difference between a peak value and a minimum value of a pulse current flow in the semiconductor laser during a recording operation. By drawing the third current from the anode of the semiconductor laser according to recording data, a high speed and high power recording operation can be effected.

2 Claims, 5 Drawing Sheets

SEMICONDUCTOR LASER DRIVE CIRCUIT INCLUDING SWITCHED CURRENT SOURCE

BACKGROUND OF THE INVENTION

1. Field of the Invention

This invention relates to a semiconductor laser driving circuit for driving a semiconductor laser used for recording and reproducing in an optical recording and reproducing apparatus.

2. Description of the Prior Art

FIG. 6 shows a conventional semiconductor laser driving circuit. When effecting using an optical recording and reproducing apparatus, an output beam of a semiconductor laser 1 is switched on and off in response to a recording signal. In particular, a current flow to the semiconductor laser 1 is switched on and off by means of a differential switching circuit composed of PNP transistors 2a and 2b. A current source 5 sets a peak value of a switching current applied to the semiconductor laser. A recording signal input 3 is supplied to the base of the PNP transistor 2a, and resistors 4a and 4b are connected to the base of the PNP type transistor 2b to set a threshold. The current flowing to the semiconductor laser is differentially switched in response to the recording signal output 3.

The semiconductor laser 1 shown in FIG. 6 has a cathode thereof connected to a metal case due to the structure of the semiconductor laser device or in order to perform heat radiation efficiently. The metal case of the semiconductor laser is usually grounded to a metallic part of an optical head to be equal in potential to the ground terminal of the driving circuit. In order to switch the semiconductor laser 1 whose cathode is grounded as above, the differential switching circuit is a current discharging type, and thus it is required to be composed of PNP type transistors.

With the structure as shown above, however, a switching operation having both a large magnitude of current back as 100 to 200 mA and a switching speed cannot be easily realized by means of PNP type transistor devices. This is because in the p-type semiconductor it is difficult to attain a switching characteristic responsive to a large magnitude of current at a high speed from the viewpoint of the device structure. As a result, with a P-type switching device, if a recording signal is inputted at a high speed of about 50 Mbps, the necessary high speed switching of the semiconductor laser is not possible even if a differential switching structure is employed.

SUMMARY OF THE INVENTION

In consideration of the above-mentioned problems, an object of this invention is to provide a semiconductor laser driving circuit capable of performing high speed switching with a simple structure.

In order to attain the above-mentioned object, a semiconductor laser driving circuit of this invention comprises a semiconductor laser, a first current source which is connected in series to an anode of the semiconductor laser for applying a current to the semiconductor laser to thereby set a predetermined direct current value, a second current source which is connected to the anode of the semiconductor laser for applying a current to or drawing a current from said semiconductor laser to thereby set a peak value of a current flowing in the semiconductor laser, and a switching current source which is connected in parallel to the semiconductor laser from a connecting point of the semiconductor laser and the first current source for switching a current flow from the semiconductor laser, whereby the peak value and a bottom value of the pulse current flowing in the semiconductor laser are switched.

With the circuit structure as above, even with a semiconductor laser whose cathode is connected to a ground terminal of the driving circuit, a semiconductor laser driving circuit can be easily realized that is capable of performing high speed switching in response to a recording signal input which is as large in magnitude as 100 to 200 mA and yet, as high in speed as 50 Mbps.

By employing the semiconductor laser driving circuit of this invention, even with a recording signal of high transmission rate, an optical disk recording can be realized with high reliability.

DESCRIPTION OF THE PREFERRED EMBODIMENTS

Figure 2:
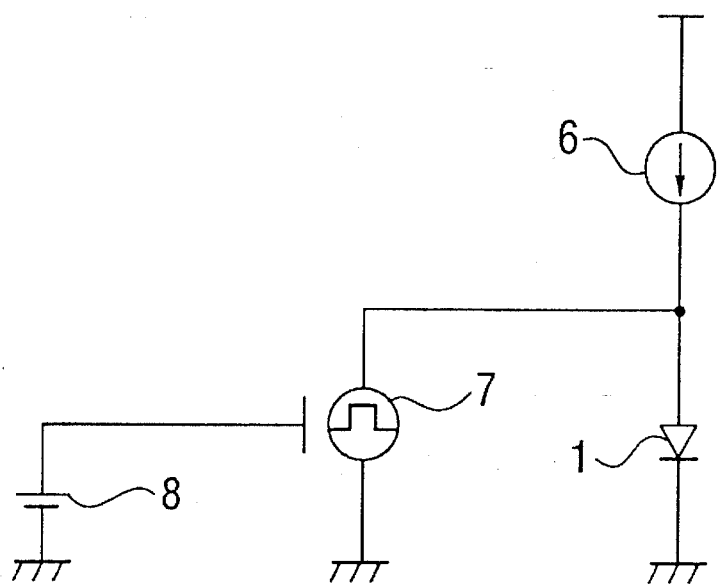
FIG. 2 is a schematic circuit diagram of a semiconductor laser driving circuit of this invention.

FIG. 2 is a schematic circuit diagram common to a first embodiment and a second embodiment of a semiconductor laser driving circuit of this invention.

In FIG. 2, a current output from a first current source 6 is delivered to a semiconductor laser 1 and a switching current source 7 connected in parallel to the semiconductor laser 1. The semiconductor laser 1 has its cathode connected to ground. A control voltage source 8 controls a current value of the switching current source 7. As shown above, by indirectly switching the current of the switching current source 7, the current flow to the semiconductor laser 1 can be switched.

Figure 6:
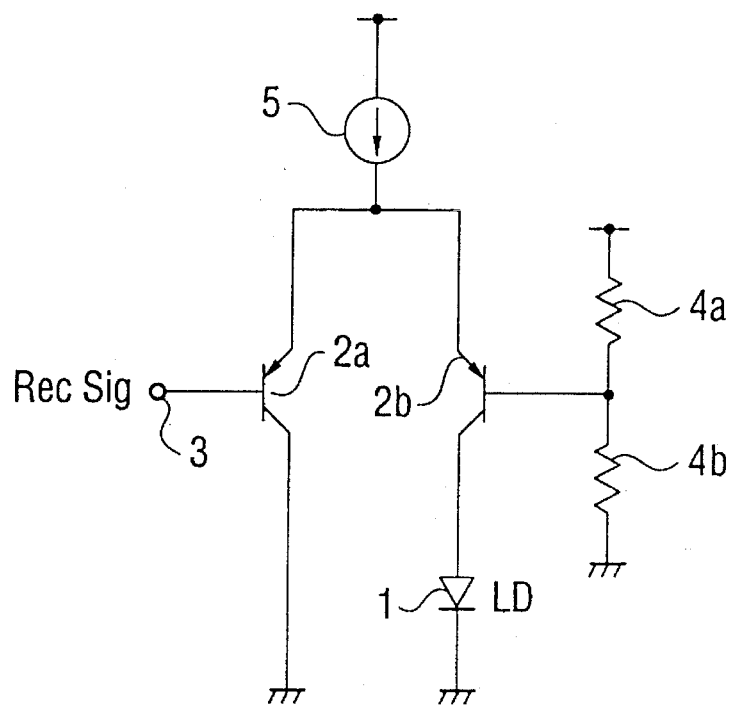
FIG. 6 is a circuit diagram of a conventional semiconductor laser driving circuit.

In order to directly switch the current flow to the semiconductor laser whose cathode is grounded, it is necessary to provide a discharging type of differential switching circuit. As a result, as shown in FIG. 6, it is necessary to use PNP transistors 2a and 2b having a low switching speed. However, by switching the current of the switching current source 7 as shown in FIG. 2, it becomes possible to use a differential switching circuit of a charging type, which is easily composed of NPN type transistors or N-channel GaAs FETs having a high switching speed.

Figure 1:
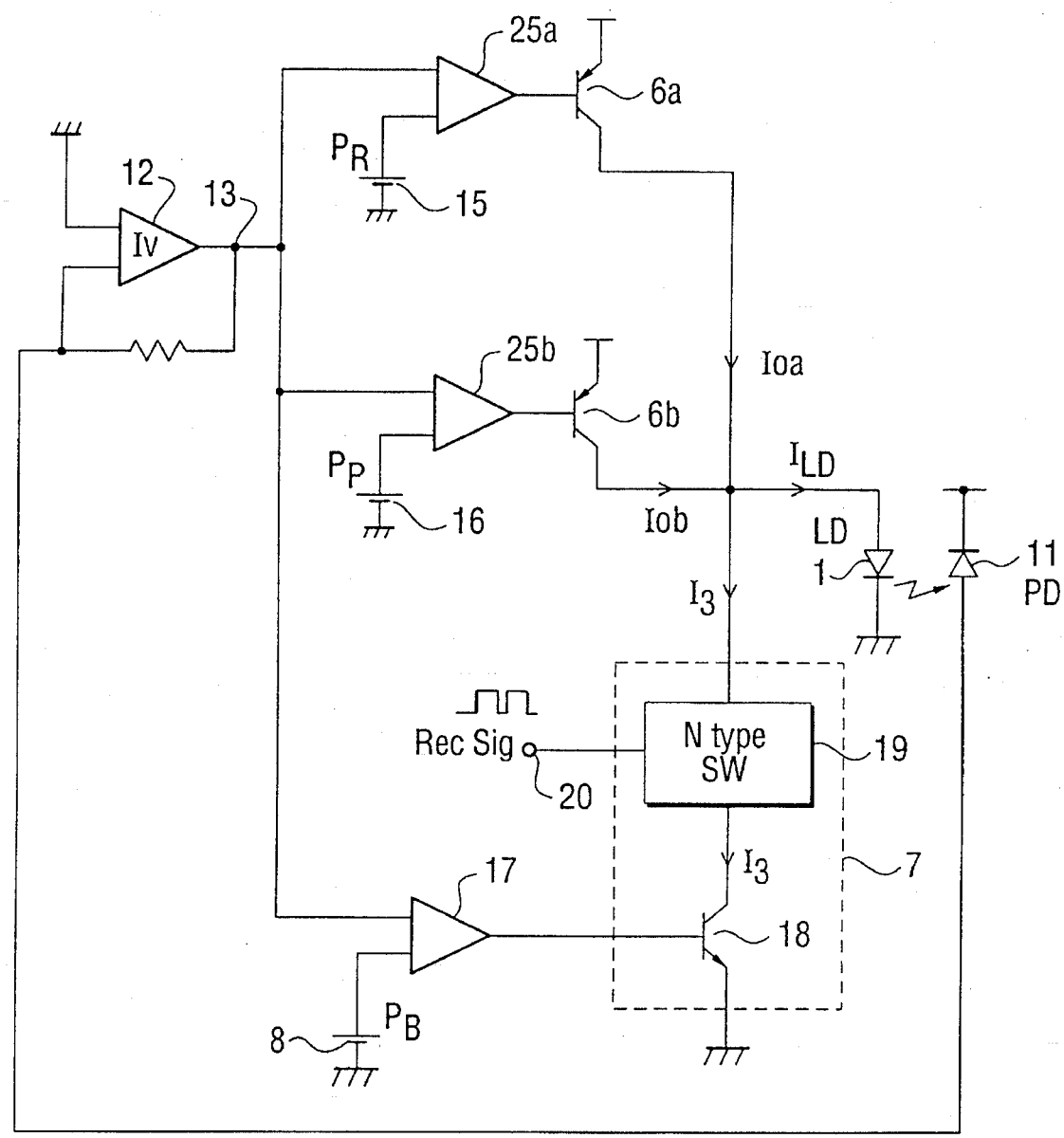
FIG. 1 is a circuit diagram of a semiconductor laser driving circuit according to a first embodiment of this invention.

FIG. 1 is a detailed circuit diagram of the first embodiment of this invention.

A reproducing operation will be first explained below. An optical output of the semiconductor laser 1 is received by a photodiode 11 and converted to an optical current. The optical current is sent to an IV converter 12 to be converted into a light receiving voltage 13. The light receiving voltage 13 is compared through an operational amplifier 25a with a reference voltage source 15 equivalent to a DC power ray $P_R$ of the semiconductor laser when reproducing and outputted to control a current of a first current source 6a to be a current $I_{0a}$. In this case, a laser current $I_{LD}$ flow to the semiconductor laser 1 becomes $L_{LD}=I_{0a}$, and the optical output can be controlled to the DC power ray $P_R$ when reproducing.

Next, a recording operation will be explained below. When recording, a peak value and a bottom value of an optical pulse is controlled and set according to a setting area of the optical power level of the semiconductor laser 1 disposed on a format of an optical disk. The current $I_{0a}$ of the first current source 6a is added with a current $I_{0b}$ of a second current source 6b to control and set the current equivalent to the peak value of the optical pulse. An electric current $I_3$ is subtracted from that of the peak value thus obtained by addition to thereby control and set the current equivalent to the bottom value of the optical pulse.

First, an explanation will be given as to the control of the peak value of the optical pulse. The optical output of the semiconductor laser 1 is received, as in the reproducing case, by the photodiode 11 and converted to an optical current. The optical current is sent to the IV converter 12 to be converted into the light receiving voltage 13. The light receiving voltage 13 is compared through an operational amplifier 25b with a reference voltage source 16 equivalent to the peak value $P_P$ of the optical pulse of the semiconductor laser 1 when reproducing and outputted to control the current $I_{0b}$ of the second current source 6b. The laser current $I_{LD}$ to the semiconductor laser 1 becomes as $I_{LD}=I_{0a}+I_{0b}$. As a result, the optical output is controlled to the peak value $P_P$ of the optical pulse when recording.

Next, an explanation will be given as to the control of the bottom value of the optical pulse. In this case, the light receiving voltage 13 is compared through an operational amplifier 17 with a reference voltage source 8 equivalent to the bottom value $P_B$ of the optical pulse of the semiconductor laser 1 when recording and outputted to control the current of a constant current source 18 forming the switching current source 7.

In FIG. 1, 19 is a switching circuit of a differential type using NPN type transistors or n-type semiconductors composed of N-channel FETs. When a recording signal 20 is at a low level, the switching circuit 19 becomes ON to conduct a current $I_3$ to thereby control and set the optical output to the bottom value of the optical pulse. When it is at a high level, it becomes OFF, so that the current $I_3$ becomes zero and the peak value of the optical pulse is maintained. That is, the laser current $I_{LD}$ to be applied to the semiconductor laser 1 at the bottom value of the optical pulse becomes $I_{LD}=I_{0a}+I_{0b}-I_3$, so that the optical output is set and controlled to the bottom value $P_B$ of the optical pulse when recording.

Even with the semiconductor laser whose cathode is grounded as shown above, by indirectly switching the current $I_3$ delivered separately from the semiconductor laser 1, the current to be applied to the semiconductor laser 1 can be switched at a high speed.

Figure 3:
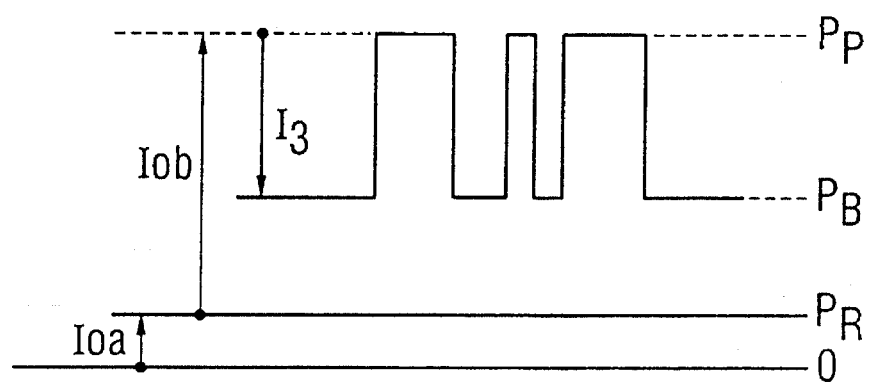
FIG. 3 is an operational waveform diagram of the semiconductor laser driving circuit shown in FIG. 1.

FIG. 3 is a diagram showing the relationship of the light emitting output of the semiconductor laser 1 and the current value of each component. In FIG. 3, the symbols shown on the right side respectively indicate output power values, and the symbols $P_P$, $P_B$ and $P_R$ correspond respectively to those shown in FIG. 1. The symbols shown on the left side respectively indicate currents, and the symbols $I_{0a}$, $I_{0b}$ and $I_3$ also correspond to those shown in FIG. 1. The length of each of the arrows shown in FIG. 3 indicates the magnitude of the corresponding current, and the direction thereof is upward when discharging and downward when charging.

When reproducing, the current $I_{LD}$ flow to the semiconductor laser 1 becomes $I_{LD}=I_{0a}$, and the light emission of the DC power ray $P_R$ is obtained.

Next, at the peak value of the optical pulse when recording, because the switching circuit 19 becomes OFF, the current $I_{0a}$ when reproducing is added with the current $I_{0b}$, and the current $I_{LD}$ flow to the semiconductor laser 19 becomes $I_{LD}=I_{0a}+I_{0b}$, so that the light emission is made at the peak value $P_P$ of the optical pulse.

Further, at the bottom value of the optical pulse when recording, because the switching circuit 19 becomes ON and the current $I_3$ is subtracted from the added current $I_{0a}+I_{0b}$, the current $I_{LP}$ flow to the semiconductor laser 1 becomes $I_{LD}=I_{0a}+I_{0b}-I_3$, and the light emission is made at the bottom value $P_B$ of the optical pulse.

As explained above, even with the semiconductor laser whose cathode is grounded, by indirectly switching the current $I_3$, the current flow to the semiconductor laser 1 is set to the peak value and bottom value of the optical pulse to thereby effect high speed switching.

Figure 7:
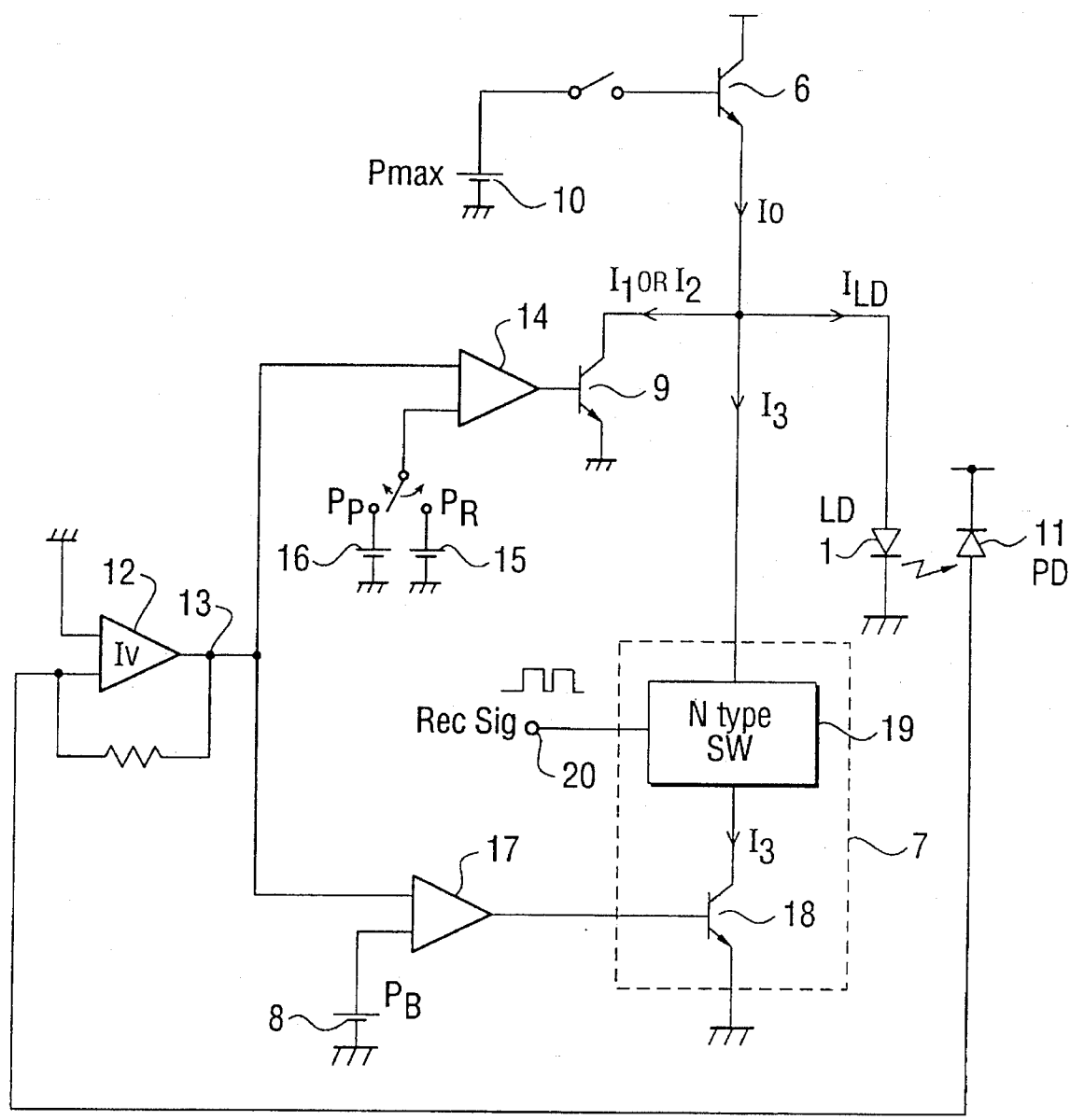
FIG. 7 is a circuit diagram of a semiconductor laser driving circuit according to a second embodiment of this invention.

FIG. 7 is a detailed circuit diagram of a second embodiment of this invention. A total current $I_0$ flow from a first current source 6 is separately delivered as a laser electric current $I_{LD}$ to a semiconductor laser 1 whose cathode is grounded, a switching current $I_3$ to a switching current source 7, and a current $I_1$ to a second current source 9 when reproducing or a current $I_2$ to the second current source 9 when recording.

Here, the total current $I_0$ is set through a control voltage source 10 to the maximum current for driving the maximum optical output $P_{max}$ which does not deteriorate nor damage the semiconductor laser 1 even if $I_1+I_3$ or $I_2+I_3$ becomes zero and $I_0=I_{LD}$.

The reproducing operation will be first described below. The optical output is received and converted to an optical current by a photodiode 11. The optical current is sent to an IV converter 12 to be converted into a light receiving voltage 13. The light receiving voltage 13 is compared through an operational amplifier 14 with a reference voltage source 15 equivalent to the DC power ray $P_R$ of the semiconductor laser when reproducing and outputted to control the current of the second current source 9 to the current $I_1$. The laser current $I_{LD}$ flow the semiconductor laser 1 becomes $I_{LD}=I_0-I_1$, and the optical output is controlled to the DC power ray $P_R$ when reproducing.

Next, the recording operation will be explained below. When recording, the peak value and the bottom value of the optical output are controlled and set according to the setting area of the optical power level of the semiconductor laser 1 disposed on the format of an optical disk. The total current $I_o$ when recording is separated into $I_2$ and $I_3$, and the current $I_2$ controls and sets the current equivalent to the peak value of the optical pulse, and the current $I_3$ controls and sets the current equivalent to the bottom value of the optical pulse.

The control of the peak value of the optical pulse will be first explained below. The optical output of the semiconductor laser 1 is received, as in the case of reproduction, by the photodiode 11 and converted to the optical current. The optical current is sent to the IV converter 12 to be converted into the light receiving voltage 13. The light receiving voltage 13 is compared through the operational amplifier 14 with a reference voltage source 16 equivalent to the peak value of the optical pulse of the semiconductor laser 1 when recording and outputted to control the current of the second current source 9 to the current $I_2$. The laser current $I_{LD}$ flow to the semiconductor laser 1 becomes $I_{LD}=I_0-I_2$, and the optical output is controlled to the peak value $P_P$ of the optical pulse when recording.

Next, the control of the bottom value of the optical pulse will be explained below. In this case, the light receiving voltage source 3 is compared through an operational amplifier 17 with a reference voltage source 8 equivalent to the bottom value $P_B$ of the optical pulse of the semiconductor laser 1 when recording and outputted to control the current of a constant current source 18 forming the switching current source 7 to the current $I_3$.

In FIG. 7, 19 is a switching circuit of a differential type, in which NPN type transistors or N-type semiconductors composed of N-channel FETs are used. When a recording signal 20 is at a low level, the switching circuit 19 becomes ON to conduct the current $I_3$ to thereby control and set the optical output to the bottom value of the optical pulse. When it is at a high level, it becomes OFF, so that the current $I_3$ becomes zero and the peak value of the optical pulse is maintained. That is, the laser current $I_{LD}$ flow to the semiconductor laser 1 at the bottom value of the optical pulse becomes $I_{LD}=I_0-I_2-I_3$, so that the optical output is controlled and set to the bottom value $P_B$ of the optical pulse when recording.

Even with the semiconductor laser whose cathode is grounded, by indirectly switching the current $I_3$ delivered separately from the semiconductor laser 1, the current flow to the semiconductor laser 1 can be switched at a high speed.

Figure 8:
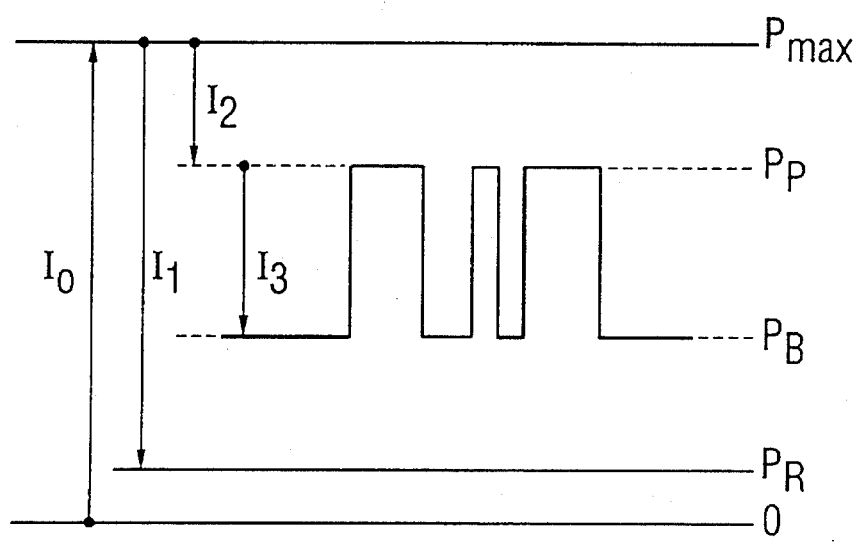
FIG. 8 is an operational waveform diagram of the semiconductor laser driving circuit shown in FIG. 7.

FIG. 8 is a diagram showing the relationship between the light emitting output of the semiconductor laser 1 and the current value of each component in FIG. 8, the symbols shown on the right side respectively indicate output power values, and the symbols $P_{max}$, $P_P$, $P_B$ and $P_R$ correspond respectively to those shown in FIG. 7. The symbols shown on the left side respectively indicate currents, and the symbols $I_0$, $I_1$, $I_2$ and $I_3$ correspond respectively to those shown in FIG. 7. The magnitude of each current is indicated by a corresponding one of the arrows shown in FIG. 8, and the direction thereof is upward when discharging and downward when charging.

When reproducing, because the current $I_1$ is delivered separately from the total current $I_0$, the current $I_{LD}$ flow to the semiconductor laser 1 becomes $I_{LD}=I_0-I_1$, and the light emission of the DC power ray $P_R$ is obtained.

Next, at the peak value of the optical pulse when recording, because the switching circuit 19 becomes OFF, only the current $I_2$ is delivered separately from the total current $I_0$, and the current $I_{LD}$ flow to the semiconductor laser 1 becomes $I_{LD}=I_0-I_2$, so that the light emission is made at the peak value $P_P$ of the optical pulse.

Further, at the bottom value of the optical pulse when recording, because the switching circuit 19 becomes ON and the currents $I_2$ and $I_3$ are delivered separately from the total current $I_0$, the current $I_{LD}$ flow to the semiconductor laser 1 becomes $I_{LD}=I_0-I_2-I_3$, so that the light emission is made at the bottom value $P_B$ of the optical pulse.

As shown above, even with the semiconductor laser whose cathode is grounded, by switching between the currents $I_2$ and $I_3$ which are delivered separately from the semiconductor laser 1, the current flow to the semiconductor laser 1 is set to the peak value and bottom value of the optical pulse to thereby obtain high speed switching.

Figure 4:
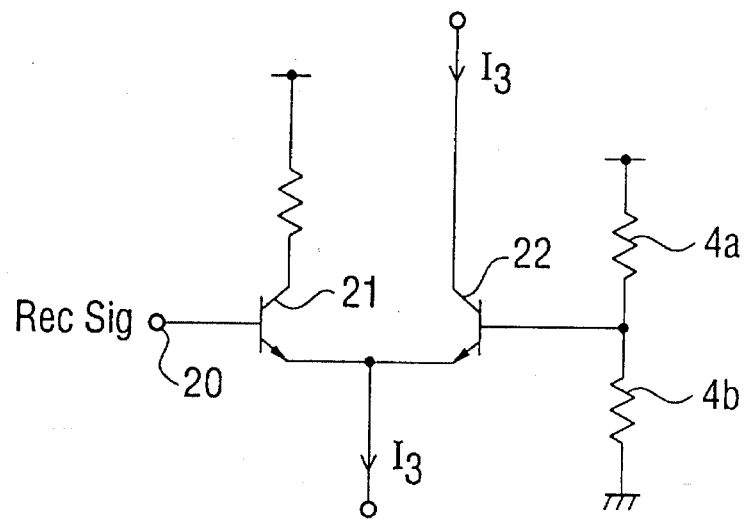
FIG. 4 is a circuit diagram of a switching circuit 19 according to a third embodiment of this invention.

FIG. 4 is a circuit diagram of a third embodiment of the switching circuits 19 shown respectively in FIG. 1 according to the first embodiment and in FIG. 7 according to the second embodiment. The switching circuit 19 may be of the charging type, so that a high speed differential switching circuit can be easily composed of NPN type transistors.

In the third embodiment, a differential switching circuit is composed of NPN type transistors 21 and 22. A recording signal 20 is supplied to the base of the NPN type transistor 21, and a threshold voltage source voltage-divided and set by resistors 4a and 4b is supplied to the base of the transistor 22. The current $I_3$ setting the bottom value of the optical pulse is charged into the differential switching circuit as composed above to thereby switch the current $I_3$ at a high speed in response to the recording signal 20.

As shown above, even if the current flow to the semiconductor laser 1 is as large in magnitude as 100 to 200 mA and yet, the recording signal to be inputted of a high such as 50 Mbps, by forming the differential switching circuit of the NPN type transistors 21 and 22, high speed switching can be easily realized.

Figure 5:
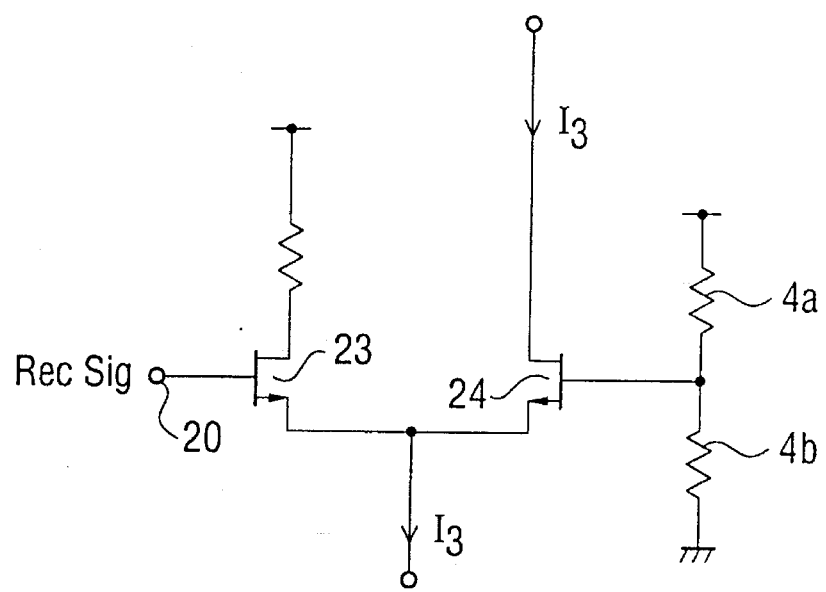
FIG. 5 is a circuit diagram of a switching circuit 19 according to a fourth embodiment of this invention.

FIG. 5 is a circuit diagram of a fourth embodiment of the switching circuits 19 respectively shown in FIG. 1 according to the first embodiment and in FIG. 7 according to the second embodiment. The switching circuit 19 may be of the charging type, so that a differential switching circuit higher in switching speed than the NPN type transistors can be formed by using N-channel FETs of GaAs and the like.

In the fourth embodiment, a differential switching circuit is composed of N-channel FETs 23 and 24. A recording signal 20 is supplied to the gate of the N-channel FET 23, and a threshold voltage source voltage-divided and set by resistors 4a and 4b is supplied to the gate of the N-channel FET 24. The current 13 setting the bottom value of the optical pulse is charged into the differential switching circuit as composed above to thereby switch the current $I_3$ at a high speed in response to the recording signal 20.

As shown above, even if the current flow to the semiconductor laser 1 is as large in magnitude as 100 to 200 mA and yet, the recording signal to be inputted has as a high speed such as 50 Mbps, a differential switching circuit higher in switching speed than the NPN type transistors can be realized by using N-channel FETs 23 and 24 as shown above.

What is claimed is:

1. A semiconductor laser drive circuit comprising:

a semiconductor laser having a cathode that is grounded;

a photodiode for receiving an optical output of said semiconductor laser and outputting a corresponding optical current;

a converter for converting the optical current output by said photodiode into a voltage output;

a first voltage source for generating a first voltage having a first predetermined value indicative of a direct current flowing in said semiconductor laser during a reproducing operation;

a first operational amplifier for comparing the voltage output of said converter with the first voltage generated by said first voltage source and outputting a corresponding first control voltage;

a first current source for supplying a first current corresponding to the direct current to an anode of said semiconductor laser responsive to the first control voltage;

a second voltage source for generating a second voltage having a second predetermined value indicative of a peak value of an optical pulse current flow in said semiconductor laser during a recording operation;

a second operational amplifier for comparing the voltage output of said converter with the second voltage generated by said second voltage source and outputting a corresponding second control voltage;

a second current source for supplying a second current corresponding to the peak value of an optical pulse current flow during recording to the anode of said semiconductor laser responsive to the second control voltage;

a third voltage source for generating a third voltage having a third predetermined value indicative of a minimum value of the optical pulse current;

a third operation amplifier for comparing the voltage output of said converter with the third voltage generated by said third voltage source and outputting a corresponding third control voltage;

a third current source for drawing a third current having a value corresponding to a difference between the peak value and the minimum value of the optical pulse current from said anode of said semiconductor laser responsive to the third control voltage;

a switching circuit which enables said third current source to draw said third current from said anode of said semiconductor laser when switched in a first state and prevents said third current source from drawing said third current from said anode of said semiconductor laser when switched in a second state.

2. A semiconductor laser drive circuit comprising:

a semiconductor laser having a cathode that is grounded;

a photodiode for receiving an optical output of said semiconductor laser and outputting a corresponding optical current;

a converter for converting the optical current into a voltage output;

a first voltage source for generating a first voltage having a first predetermined value indicative of a maximum direct current flow in said semiconductor laser;

a first current source for supplying a first current corresponding to the maximum direct current flow to an anode of said semiconductor laser using an output voltage of said first voltage source;

a second voltage source for generating a second voltage having a second predetermined value indicative of a peak value of an optical pulse current flow in said semiconductor laser during a recording operation;

a third voltage source for generating a third voltage having a third predetermined value indicative of a reproducing direct current flow in said semiconductor laser during a reproducing operation;

a first operational amplifier for selectively comparing the voltage output of said converter with the second voltage of said second voltage source or the third voltage of said third voltage source and outputting a corresponding first control voltage;

a second current source for selectively drawing either one of a second current having a value corresponding to a difference between the maximum direct current flow and the peak value of the optical pulse current during recording and a third current having a value corresponding to a difference between the maximum direct current flow and a value of the reproducing direct current flow from the anode of the semiconductor laser responsive to the first control voltage;

a fourth voltage source for generating a fourth voltage having a fourth predetermined value indicative of a minimum value of the optical pulse current;

a second operational amplifier for comparing the voltage output of said converter with the fourth voltage of said fourth voltage source and outputting a corresponding second control voltage;

a third current source for drawing a fourth current having a value corresponding to a difference between the peak value and the minimum value of the optical pulse current from said anode of said semiconductor laser responsive to the second control voltage; and a switching circuit which enables said third current source to draw said fourth current from said anode of said semiconductor laser when switched in a first state and prevents said third current source from drawing said fourth current from said anode of said semiconductor laser when switched in a second state.

* * * * *